(12) United States Patent
Feng

(10) Patent No.: US 11,665,819 B2
(45) Date of Patent: May 30, 2023

(54) DRIVING CIRCUIT BOARD AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Binfeng Feng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 873 days.

(21) Appl. No.: 16/330,471

(22) PCT Filed: Aug. 27, 2018

(86) PCT No.: PCT/CN2018/102506
§ 371 (c)(1),
(2) Date: Mar. 5, 2019

(87) PCT Pub. No.: WO2019/080630
PCT Pub. Date: May 2, 2019

(65) Prior Publication Data
US 2021/0345478 A1    Nov. 4, 2021

(30) Foreign Application Priority Data
Oct. 26, 2017   (CN) .......................... 201711013487.7

(51) Int. Cl.
*H05K 1/02*      (2006.01)
*H01L 25/18*     (2023.01)
*H05K 1/18*      (2006.01)

(52) U.S. Cl.
CPC ............. *H05K 1/028* (2013.01); *H01L 25/18* (2013.01); *H05K 1/189* (2013.01); *H05K 2201/10128* (2013.01)

(58) Field of Classification Search
CPC ........... H05K 1/02; H05K 2201/10128; H05K 1/189; H05K 1/028; H01L 25/18
(Continued)

(56) References Cited

U.S. PATENT DOCUMENTS

2018/0090698 A1\* 3/2018 Jeong .................... H01L 51/003
2018/0116046 A1  4/2018 Lu et al.

FOREIGN PATENT DOCUMENTS

CN    101126852 A    2/2008
CN    103489369 A    1/2014
(Continued)

OTHER PUBLICATIONS

First Office Action dated Mar. 13, 2019; Corresponding to Chinese Application No. 201711013487.7; English Translation Attached.
(Continued)

*Primary Examiner* — Tremesha S Willis
(74) *Attorney, Agent, or Firm* — Nath, Goldberg & Meyer; Joshua B. Goldberg

(57) ABSTRACT

There is disclosed a driving circuit board for a display device. The driving circuit board is foldable. The driving circuit board is provided with a through hole which penetrates through the driving circuit board and which is located at a foldable portion of the driving circuit board. The disclosure also provides a display device.

8 Claims, 2 Drawing Sheets

(58) Field of Classification Search
USPC .......................................................... 361/749
See application file for complete search history.

(56) References Cited

FOREIGN PATENT DOCUMENTS

| | | |
|---|---|---|
| CN | 106028769 A | 10/2016 |
| CN | 107546252 A | 1/2018 |
| CN | 207765448 U | 8/2018 |
| JP | 2009075498 A | 4/2009 |

OTHER PUBLICATIONS

International Search Report; Application No. PCT/CN2018/102506; dated Nov. 29, 2018.

* cited by examiner

B-B'

DRIVING CIRCUIT BOARD AND DISPLAY DEVICE

This is a National Phase Application filed under 35 U.S.C. 371 as a national stage of PCT/CN2018/102506, filed on Aug. 27, 2018, an application claiming the benefit of Chinese Application No. 201711013487.7, filed on Oct. 26, 2017, the content of each of which is hereby incorporated by reference in its entirety.

FIELD OF THE INVENTION

The present disclosure relates to the field of display technologies, and in particular, to a driving circuit board and a display device.

BACKGROUND

Organic Light-Emitting Device (OLED) has the advantages of active illumination, excellent temperature characteristics, low power consumption, fast response, wide viewing angle, ultra-thin and low cost, and has been widely used in display devices. As the size of the display device becomes larger and the resolution becomes higher, the number of leads on the display substrate of the display device increases and the length of the driving circuit board increases accordingly. Therefore, the bending resistance of the driving circuit board is increased, such that the curvature of the bending portion of the driving circuit board is reduced and the bending radius is increased, which is disadvantageous for the realization of the narrow bezel.

SUMMARY

The disclosure provides a driving circuit board for a display device, the driving circuit board being foldable, wherein the driving circuit board is provided with a through hole which penetrates through the driving circuit board and which is located at a foldable portion of the driving circuit board.

Optionally, the display device comprises a display substrate having a display area and a lead area around the display area, the lead area being provided with a lead extending from the display area; and one end of the driving circuit board is configured to couple to the lead area to electrically connect to the lead in the lead area, and the other end of the driving circuit board is configured to couple to a side of the display substrate facing away from a light emitting direction.

Optionally, the driving circuit board comprises a substrate, and a signal line and a driving chip disposed on the substrate, the signal line is configured to connect the driving chip and the lead in the lead portion, and the signal line is located in a region on the driving circuit board where the through hole is not provided.

Optionally, the driving circuit board further comprises a first protective layer disposed on the substrate, and the first protective layer covers at least a portion of the signal line at the foldable portion.

Optionally, a plurality of through holes are provided, and an arrangement direction of the through holes is perpendicular to a folding direction of the driving circuit board.

Optionally, a plurality of driving chips are provided; and along the arrangement direction of the through holes, the plurality of through holes and the plurality of driving chips are alternately arranged.

Optionally, a thickness of the substrate ranges from 20 µm to 50 µm.

Accordingly, the disclosure also provides a display device, comprising a display substrate and the driving circuit board as set forth above.

Optionally, the display substrate comprises a display area and a lead area around the display area, the lead area being provided with a lead extending from the display area; and one end of the driving circuit board is configured to couple to the lead area to electrically connect to the lead in the lead area, and the other end of the driving circuit board is configured to couple to a side of the display substrate facing away from a light emitting direction.

Optionally, the driving circuit board comprises a substrate, and a signal line and a driving chip disposed on the substrate, the display substrate includes a base and a second protective layer disposed on a side of the base, the lead in the lead area is disposed on a side of the base facing away from the second protective layer, and the base and the substrate are formed as an integral structure.

Optionally, the display substrate further comprises a buffer layer, and the buffer layer is located on a side of the second protective layer facing away from the base.

Optionally, a plurality of the driving circuit boards are provided, and the plurality of driving circuit boards are located at different edges of the display substrate.

BRIEF DESCRIPTION OF THE DRAWINGS

The accompanying drawings are intended to provide a further understanding of the disclosure, constitute a part of the specification, and are provided to explain the disclosure together with the following specific embodiments. However, the accompanying drawings are not intended to limit the disclosure. In the drawing.

DETAILED DESCRIPTION OF THE EMBODIMENTS

Specific embodiments of the present disclosure will be described in detail below with reference to the accompanying drawings. It is to be understood that the specific embodiments described herein are provided for illustrative and explanative purposes and are not intended to limit the disclosure.

Figure 1:
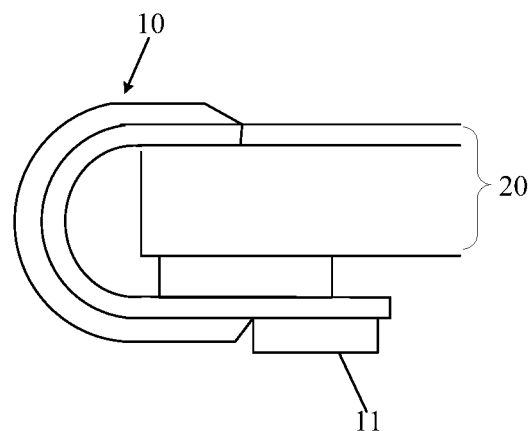
FIG. 1 is a schematic diagram of a driving circuit board for display device in the related art.

As shown in FIG. 1, in an organic electroluminescence display device, a driving chip 11 is disposed on a driving circuit board 10 and is electrically connected to a lead on a display substrate 20 via a signal line on the driving circuit board, so as to supply a drive signal to the display substrate 20. One end of the driving circuit board 10 connected to the display substrate 20 is folded toward a side of the display substrate 20 facing away from a light emitting direction, such that the other end of the driving circuit board 10 is located on the side of the display substrate 20 facing away from the light emitting direction.

As an aspect of the present disclosure, there is provided a driving circuit board 10 for use in a display device, the driving circuit board 10 being foldable, wherein the driving circuit board 10 is provided with a through hole 12 which penetrates through the driving circuit board 10 and which is located at a foldable portion of the driving circuit board 10.

Figure 4:
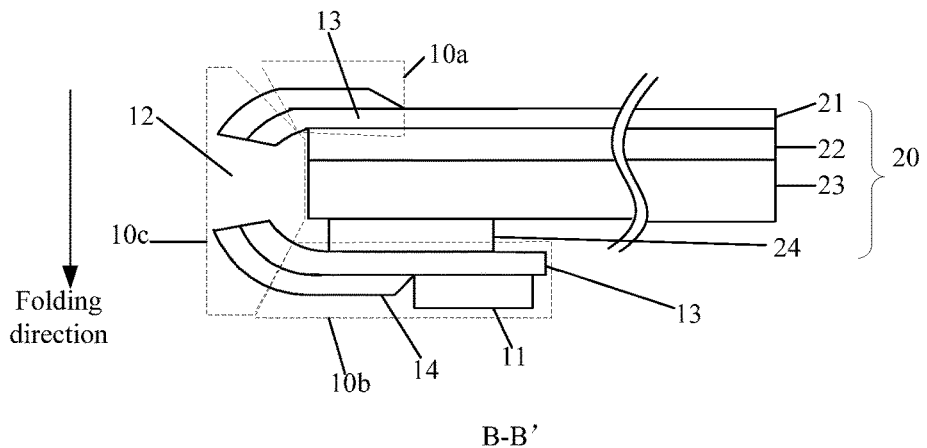
FIG. 4 is a cross-sectional view taken along line B-B' of FIG. 3.

It should be understood that when the driving circuit board 10 is folded, the foldable position forms a curved surface structure. As shown in FIG. 4, after the driving circuit board 10 is folded, a longitudinal section thereof is formed in a U shape. At this time, the driving circuit board 10 is divided into a first plate portion 10a, a second plate portion 10b, and an arcuate connecting portion 10c that connects the first plate portion 10a and the second plate portion 10b. The first plate portion 10a may be connected to a lead portion, the second plate portion 10b is located on a side of the first plate portion 10a facing away from the light emitting direction, the arcuate connecting portion 10c as the foldable portion of the driving circuit board 10 is opposed to an end face of the display substrate 20, and the through hole 12 is located at the arcuate connecting portion 10c. A radius of circumferential surface on which the surface of the arcuate connecting portion 10c is located is the bending radius when the driving circuit board 10 is folded. It should be noted that the through hole 12 is arranged not to affect the normal operation of the driving circuit board 10. In other words, any conductive lines on the driving circuit board 10 are not disconnected due to the arrangement of the through hole 12.

In an embodiment of the present disclosure, the arrangement of the through hole 12 can reduce the cross-sectional area of the foldable portion, thereby lowering the bending resistance of the foldable portion of the driving circuit board 10. Therefore, the driving circuit board is more inclined to be folded, thereby increasing the bending curvature when the driving circuit board is folded and reducing the bending radius accordingly, which is advantageous for the realization of the narrow bezel.

In an embodiment, the display device may include a display substrate 20 having a display area (AA area) and a lead area around the display area (AA area), the lead area being provided with the lead extending from the display area. One end of the driving circuit board 10 is configured to couple to the lead area to electrically connect to the lead in the lead area, and the other end of the driving circuit board 10 is configured to couple to a side of the display substrate 20 facing away from the light emitting direction. Here, the "light emitting direction" is an orientation of a display surface of the display area (AA area). Taking FIG. 2 as an example, the light emitting direction of the display substrate is a direction perpendicular to the paper of FIG. 2 facing outward, and the direction facing away from the light emitting direction of the display substrate is a direction perpendicular to the paper of FIG. 2 facing inward. One end of the driving circuit board 10 is coupled to the lead area of the display substrate 20, which is advantageous for improving the assemblability of the driving circuit board 10 to the display substrate 20. Further, since the other end of the driving circuit board 10 is coupled to the side of the display substrate facing away from the light emitting direction, other components may be disposed at the other end of the driving circuit board 10 without affecting the dimension of the display area. With reference to FIGS. 2 to 5, in an embodiment, the driving circuit board 10 may include a foldable substrate 13, and a signal line 15 and a driving chip 11 disposed on the substrate 13. The signal line 15 is configured to connect the driving chip 11 and the lead 25 in the lead portion. The signal line 15 is located in a region on the driving circuit board 10 where the through hole 12 is not provided. Thus, after folded, the end of the driving circuit board 10 having the driving chip 11 can be hidden on the side of the display substrate 20 facing away from the light emitting direction, which is advantageous for increasing the dimension of the display area of the display substrate. In addition, in order to improve the flexibility of the driving circuit board 10 so as to fold the driving circuit board 10, the materials manufacturing the substrate 13 may include polyimide (PI), and a thickness of the substrate 13 ranges from 20 μm to 50 μm.

Further, as shown in FIG. 4, the driving circuit board 10 further includes a first protective layer 14 disposed on the substrate 13, and the first protective layer 14 covers at least a portion of the signal line 15 at the foldable portion.

It can be understood that when an object is bent, there is a neutral layer inside which is neither elongated nor compressed. In the case where the first protective layer 14 is not provided on the substrate 13, when the substrate 13 is folded toward the side facing away from the signal line 15, the signal line 15 will be located on the stretched surface of the substrate 13 and be stretched. After the first protective layer 14 is disposed on the substrate 13, the substrate 13 and the first protective layer 14 are simultaneously folded toward the side facing away from the first protective layer 14 (i.e., the first protective layer 14 is located outside the substrate 13 after being folded), the signal line 15 is located at or close to the neutral layer of the substrate 13 and first protective layer 14 as an integral structure, thereby preventing the signal line 15 from being broken by stretching. In addition, the arrangement of the first protective layer 14 can also prevent the signal line 15 from being scratched.

Herein the first protective layer 14 may be made of an organic polymer, and in particular, a polyester urethane adhesive (for example, MCL glue) may be used to facilitate folding.

Figure 2:
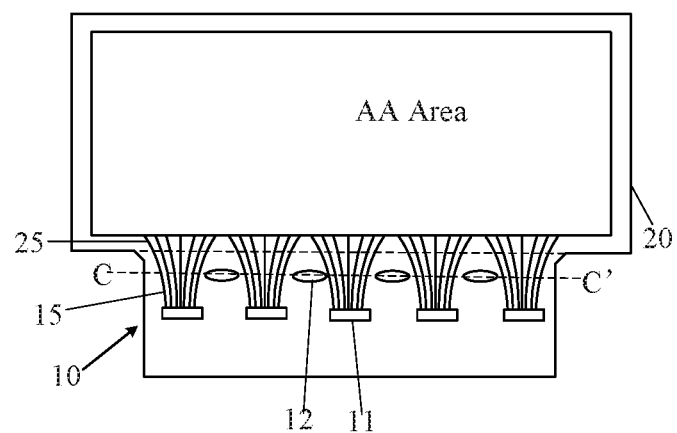
FIG. 2 is a schematic diagram showing the connection of a driving circuit board according to the present disclosure to the display substrate in an unfolded state.

The driving circuit board 10 according to an embodiment of the present disclosure is particularly suitable for use in a large-sized display device. When the size of the display device is relatively large, a length of the lead portion becomes long and a length of the driving circuit board 10 becomes long accordingly. In this case, a plurality of through holes 12 may be provided. As shown in FIG. 2, an arrangement direction of the through holes 12 is perpendicular to a folding direction of the driving circuit board 10. The folding direction herein may be defined as a direction in which a force is applied to a distal end of the driving circuit board 10 at the initial timing when the unfolded driving circuit board 10 is being folded. Specifically, in FIG. 2, the folding direction of the driving circuit board 10 is perpendicular to the paper surface. In FIG. 4, the folding direction of the driving circuit board 10 is indicated by an arrow in FIG. 4 (parallel to a thickness direction of the display substrate 20). The arrangement direction of the through holes 12 can also be regarded as an extending direction of the internal neutral axis when the driving circuit board 10 is being folded. As shown in FIG. 4, the "internal neutral axis" is an intersecting line of the internal neutral layer of the driving circuit board 10 with respect to a plane parallel to the display surface of the display substrate 20.

Herein, centers of the plurality of through holes 12 may be located on the same straight line, and when folded, it occurs along a connecting line (C-C' line in FIG. 2) of the centers of the through holes 12. The shape of the through hole 12 is not restricted in the present disclosure, and the column through hole may, for example, have a circular, elliptical, rectangular or polygonal opening.

In an embodiment of the present disclosure, a plurality of driving chips 11 may be provided, along the arrangement direction of the through holes 12, the plurality of through holes 12 and the plurality of driving chips 11 are alternately arranged. This can help the signal line 15 electrically connect the driving chip 11 to the lead in the lead area of the display substrate 20. It should be noted that the alternative arrangement of the through holes 12 and the driving chips 11 does not necessarily indicate that the through holes 12 and the driving chips 11 are located on the same straight line. As shown in FIG. 2, when the driving circuit board 10 is not folded, the plurality of through holes 12 are arranged in a row, the plurality of driving chips 11 are arranged in another row, and the orthographic projections of the through holes 12 toward a lower end of the driving chips 11 and the orthographic projections of the driving chips 11 toward a lower end of the driving circuit board 10 are alternately arranged. In addition, the alternating manner may be one-to-one interleaving or other alternating manner. For example, there are the orthographic projections of two driving chips 11 between the orthographic projections of every adjacent two through holes 12.

Figure 3:
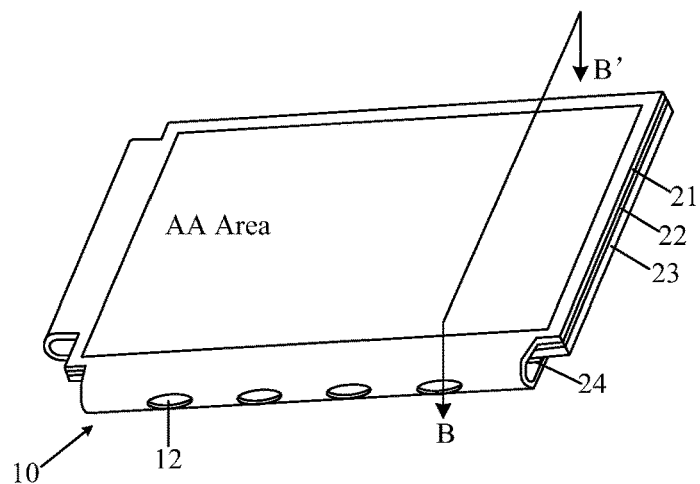
FIG. 3 is a perspective view schematically showing the driving circuit board for display device according to the present disclosure.
Figure 5:
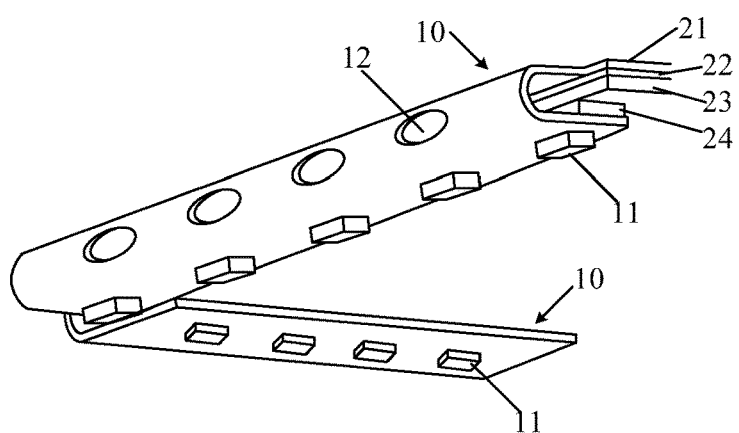
FIG. 5 is another perspective view schematically showing the driving circuit for display device board according to the present disclosure.

As another aspect of the present disclosure, there is provided a display device. As shown in FIGS. 3 and 5, the display device includes a display substrate and the above-described driving circuit board 10. Further, the display substrate may include a display area (AA area) and a lead area around the display area. One end of the driving circuit board 10 is coupled to the lead area to electrically connect to the lead in the lead area, and the other end of the driving circuit board 10 is coupled to a side of the display substrate 20 facing away from the light emitting direction. Herein, the driving circuit board 10 has a foldable structure.

In the display device, as described above, the driving circuit board 10 as a whole can be divided into three parts: a first plate portion 10a, a second plate portion 10b, and an arcuate connecting portion 10c as a foldable portion. The through hole 12 is located on the arcuate connecting portion. Herein, a plurality of the through holes 12 may be provided, and each of the through holes 12 is located at a middle portion of the arcuate connecting portion 10c in a thickness direction of the display device.

The display substrate 20 may include a base 21 on which the lead in the lead area is disposed. The base 21 may also be provided with a display element for display such as a thin film transistor. The display substrate in this embodiment is particularly suitable for an organic electroluminescence display (OLED) device. Accordingly, the base 21 may further be provided with a light emitting unit and an encapsulation layer.

The present disclosure does not limit the specific manner in which the driving circuit board 10 is coupled to the lead area of the display substrate 20. For example, the surface of the driving circuit board 10 on which the signal line 15 is disposed may be opposite to the lead area, and after the signal line 15 is bonded to the lead in the lead area, the driving circuit board 10 may be folded.

In order to simplify the overall structure of the display device, the base 21 and the substrate 13 in the embodiment of the present disclosure may be formed as an integral structure, as shown in FIGS. 3 and 4. In this case, the signal line 15 and the respective lead to which it is connected may also be formed as an integral structure; after the driving circuit board 10 is folded, the signal line 15 is located outside the substrate 13 (i.e., the side facing away from the base 21).

Since the substrate 13 has a thin thickness, that is, the base 21 has a thin thickness, in order to prevent damage to the base 21 and the leads and display elements on the base 21, as shown in FIG. 4, the display substrate 20 further includes a second protective layer 22 which is disposed on the side of the base 21 and which has the same size as the base 21. The lead 25 in the lead area is disposed on the side of the base 21 facing away from the second protective layer 22.

In an embodiment of the present disclosure, as shown in FIG. 4, the display substrate 20 may further include a buffer layer 23. The buffer layer 23 is located on the side of a second protective layer 22 facing away from the base 21, and spaces the base 21 from the second plate portion 10b of the driving circuit board 10. Herein, the buffer layer 23 may have a similar size to the second plate portion 10b of the driving circuit board 10, so as to support the driving circuit board 10 during the transfer of the display device and prevent the driving circuit board 10 from being broken due to an external force. Of course, the buffer layer 23 may also have the same size as the base 21, such that not only the driving circuit board 10 can be prevented from being broken, but also the external impact on the entire display substrate 20 can be alleviated to reduce the damage on the display substrate 20. Herein, the buffer layer 23 can be made of foam.

In an embodiment of the present disclosure, the display substrate 20 may further include a third protective layer 24 disposed on the side of the buffer layer 23 facing away from the base 21. The third protective layer 24 may have a similar size to the second plate portion 10b of the driving circuit board 10. As shown in FIG. 4, a projection of the second plate portion 10b of the driving circuit board 10 toward the base 21 is covered by a projection of the third protective layer 24 toward the base 21.

In an embodiment of the present disclosure, a plurality of the driving circuit boards 10 are provided, and the plurality of driving circuit boards 10 are located at different edges of the display substrate 20. As shown in FIGS. 3 and 5, the sides of the base 21 in its length direction and in its width direction are provided with a driving circuit board 10, respectively, and the two driving circuit boards 10 can supply a gate drive signal and a source drive signal to the display substrate 20, respectively.

Description of the driving circuit board and the display device according to the present disclosure has been provided above. It can be seen that the through holes are disposed in the foldable portion of the driving circuit board to reduce the cross-sectional area of the foldable portion, thereby lowering the bending resistance of the foldable portion of the driving circuit board. Therefore, the driving circuit board is more inclined to be folded, thereby increasing the bending curvature when the driving circuit board is folded and reducing the bending radius accordingly. When the bending radius is reduced, the width of the frame occupied by the driving circuit board in the display device can be reduced, so that the width of the frame of the display device utilizing the driving circuit board can be reduced.

It is to be understood that the above embodiments are merely exemplary embodiments employed to explain the principles of the present disclosure, but the present disclosure is not limited thereto. Various modifications and improvements can be made by those skilled in the art without departing from the spirit and essence of the disclo-

The invention claimed is:

1. A driving circuit board for a display device, the driving circuit board being foldable in a folding direction, wherein
    the driving circuit board is provided with a plurality of through holes which penetrate through the driving circuit board and which are located at a foldable portion of the driving circuit board, the foldable portion being foldable in the folding direction of the driving circuit board;
    an arrangement direction of the through holes is perpendicular to a folding direction of the driving circuit board;
    the through holes are column through holes each having an opening in a shape of an ellipse, and a direction of a major axis of the ellipse coincides with the arrangement direction of the through holes;
    the display device comprises a display substrate having a display area and a lead area around the display area, the lead area being provided with leads extending from the display area;
    one end of the driving circuit board is configured to couple to the lead area to electrically connect to the leads in the lead area, and the other end of the driving circuit board is configured to couple to a side of the display substrate facing away from a light emitting direction;
    the driving circuit board comprises a substrate, and signal lines and driving chips disposed on the substrate;
    the signal lines are configured to connect the driving chips and the leads in the lead area;
    the signal lines are located in a region on the driving circuit board where the through holes are not provided; and
    at least a part of the signal lines are located between adjacent through holes.

2. The driving circuit board according to claim 1, wherein the driving circuit board further comprises a first protective layer disposed on the substrate, and the first protective layer covers at least a portion of the signal line at the foldable portion.

3. The driving circuit board according to claim 1, wherein along the arrangement direction of the through holes, the plurality of through holes and the plurality of driving chips are alternately arranged.

4. The driving circuit board according to claim 1, wherein a thickness of the substrate ranges from 20 µm to 50 µm.

5. A display device, comprising a display substrate and the driving circuit board according to claim 1.

6. The display device according to claim 5, wherein
    the display substrate includes a base and a second protective layer disposed on a side of the base,
    the leads in the lead area are disposed on a side of the base facing away from the second protective layer, and
    the base and the substrate are formed as an integral structure.

7. The display device according to claim 6, wherein
    the display substrate further comprises a buffer layer, and
    the buffer layer is located on a side of the second protective layer facing away from the base.

8. The display device according to claim 5, wherein a plurality of the driving circuit boards are provided, and the plurality of driving circuit boards are located at different edges of the display substrate.

* * * * *